United States Patent
Schreiber et al.

(10) Patent No.: US 7,751,207 B2
(45) Date of Patent: Jul. 6, 2010

(54) POWER SEMICONDUCTOR MODULE WITH REDUCED PARASITIC INDUCTANCE

(75) Inventors: Dejan Schreiber, Stein (DE); Heinrich Heilbronner, Stein (DE)

(73) Assignee: Semikron Elektronik GmbH & Co. KG, Nurnberg (DE)

( * ) Notice: Subject to any disclaimer, the term of this patent is extended or adjusted under 35 U.S.C. 154(b) by 671 days.

(21) Appl. No.: 11/297,927

(22) Filed: Dec. 8, 2005

(65) Prior Publication Data
US 2006/0158914 A1 Jul. 20, 2006

(30) Foreign Application Priority Data
Dec. 9, 2004 (DE) ........................ 10 2004 059 313

(51) Int. Cl.
*H02M 3/335* (2006.01)
(52) U.S. Cl. .................. 363/17; 363/55; 363/56.02; 363/98; 363/132
(58) Field of Classification Search .................. 363/98, 363/17, 132, 20, 21.6, 53, 55, 56.02, 56.06
See application file for complete search history.

(56) References Cited

U.S. PATENT DOCUMENTS

| | | | | |
|---|---|---|---|---|
| 4,567,553 A | * | 1/1986 | Foch et al. ............... | 363/98 |
| 4,761,727 A | * | 8/1988 | Kammiller ............... | 363/98 |
| 5,673,188 A | * | 9/1997 | Lusher et al. ............ | 363/132 |
| 5,737,200 A | * | 4/1998 | Miyashita et al. ........ | 363/56.03 |
| 6,072,856 A | * | 6/2000 | Van Der Broeck et al. .. | 378/101 |
| 6,381,161 B2 | | 4/2002 | Mourick | |
| 6,541,838 B1 | | 4/2003 | Suetsugu et al. | |
| 6,954,367 B2 | * | 10/2005 | Yang et al. ............... | 363/98 |
| 6,977,430 B2 | | 12/2005 | Nowak | |
| 2002/0057587 A1 | * | 5/2002 | Ruthlein et al. ............ | 363/132 |

FOREIGN PATENT DOCUMENTS

| DE | 39 37 045 | 5/1991 |
|---|---|---|
| DE | 101 05 086 | 12/2001 |
| DE | 100 37 533 | 1/2002 |
| DE | 103 34 079 | 2/2005 |

* cited by examiner

Primary Examiner—Bao Q Vu
Assistant Examiner—Nguyen Tran
(74) Attorney, Agent, or Firm—Lackenbach Siegel, LLP; Andrew F. Young

(57) ABSTRACT

Proposed is a power semiconductor module with a housing and one or a plurality of half-bridge circuitries arranged therein. Each half-bridge circuitry has a first (TOP) and a second (BOT) power switch and each switch is comprised of one power transistor and a corresponding power diode (recovery diode). The power semiconductor module furthermore has a positive polarity direct current lead and a negative polarity direct current lead. Per each half-bridge circuitry it furthermore has two alternate current leads that are not directly connected electrically. Each TOP transistor is connected to the power diode of the BOT switch and a first alternate current lead and each BOT transistor is connected to the power diode of the TOP switch and a second alternate current lead.

8 Claims, 4 Drawing Sheets

POWER SEMICONDUCTOR MODULE WITH REDUCED PARASITIC INDUCTANCE

CROSS REFERENCE TO RELATED APPLICATIONS

This application claims priority to German Application DE 10 2004 059 313.2, filed Dec. 9, 2005, the contents of which are fully incorporated herein by reference.

FIGURE SELECTED FOR PUBLICATION

FIG. 3

BACKGROUND OF THE INVENTION

1. Field of the Invention

The present invention relates to a power semiconductor module having a housing and low parasitic inductance half-bridge circuitry. More specifically, the present invention relates to half-bridge circuits having a first (TOP) and a second (BOT) power switch with each power switch being comprised of at least one power transistor and at least a corresponding power diode, a so-called recovery diode.

2. Description of the Related Art

The related art is reflected in DE 39 37 045 A1 and DE 100 37 533 C1. DE 39 37 045 describes a circuitry for a half-bridge for reducing parasitic inductance in the direct current leads. The two direct current leads are arranged in close proximity to each other, however, with the alternating current lead between plus and minus lead, and at least partially parallel with regard to each other. This design results in a reduction of the area that is surrounded by current in the area of the arrangement of the leads with close proximity and thus in relatively low inductance of this section of the leads.

DE 39 37 045, however, does not achieve the objective of obtaining minimal parasitic inductance for two major reasons.

First, the direct current leads are not arranged at a minimum distance with regard to each other since the alternating current lead is arranged between the two direct current leads. Thus the area surrounded by current in the area of the direct current lead is not minimal and therefore the inductance for this area is not minimal either.

Secondly, the first and the second power switches are arranged relatively far from each other, which also increases parasitic inductance.

DE 100 37 533 C1 discloses a more modern, very elaborate, but also very effective circuitry for reducing parasitic inductance. Here, all areas surrounded by current within a power semiconductor module are minimized to the greatest degree possible. The disadvantage is the considerably elaborate design and manufacture of such an embodiment of a power semiconductor module.

All power semiconductor modules according to the conventional state of the art have an alternating voltage output per half-bridge circuit. Unfortunately, this is disadvantageous, if the outside wiring of the power semiconductor module is to be different based on whether the current flows via the first (TOP) or the second (BOT) branch of the respective half-bridge.

Referring now to FIGS. 1A and 1B, a schematic view of the conventional art of power semiconductor modules with half or three-phase bridge circuitry is provided.

FIG. 1A shows a schematic view of a power semiconductor module with a housing 30. Arranged in the housing are a first (TOP) and a second (BOT) power switch. Respective power switches are comprised of at least one power transistor 10, 12, preferably a IGBT (insulated gate bipolar transistor) and at least an anti-parallel recovery diode 20, 22 and in which the respective transistors and corresponding recovery diodes are arranged in close proximity to each other.

The TOP switch is connected to a positive polarity direct current lead 40 and the BOT switch is connected to a negative polarity direct current lead 50. Both switches furthermore are connected to each other and an alternate current lead 60.

FIG. 1B shows another power semiconductor module with a related housing. In the module shown, three half-bridge circuitries are arranged in parallel, and form a three-phase bridge circuit.

Each of these half-bridges has the same arrangement as described above in FIG. 1A, but in three. For example, power transistors 10 and 12 are now power transistors 10a, 10b, and 10c and 12a, 12b, and 12c, respectively, and recovery diodes 20, 22 are now 20a, 20b, 20c and 22a, 22b, and 22c, respectively.

Additionally, the respective TOP switches are connected to the positive polarity direct current 40 and the respective BOT switches are connected to the negative polarity direct current lead 50. As shown, each half-bridge circuit is now connected with its own alternate current lead 60a, 60b, and 60c respectively that leads out from housing 30.

As noted earlier, what is not appreciated by the prior art is the need for the specific and simple circuitry provided by the present invention that overcomes each of the detriments noted above.

Accordingly, there is a need for an improved power semiconductor module with reduced parasitic inductance, can be easily manufactured, and in addition allows for flexible wiring of alternating current output lines.

OBJECTS AND SUMMARY OF THE INVENTION

Introduced is a power semiconductor module with reduced parasitic inductance on the inside of the power semiconductor module compared to standard power semiconductor modules. Considered are power semiconductor modules whose internal circuitry is arranged as half-bridge circuits. Also considered are such power semiconductor modules whose internal circuitry is arranged as parallel circuits comprised of several half-bridge circuits, such as full bridge circuits as well as three-phase bridge circuits for example, or parallel circuits of several suitable partial circuits of half-bridges.

An object of the present invention is to provide a power semiconductor module that achieves at least one of a low parasitic inductance, can easily be manufactured, and obviously, allows for flexible wiring of the alternating current output.

Another object of the present invention, is to provide a power semiconductor module having a housing having, in a one embodiment, one or a plurality of parallel half-bridge circuitries. Each of these half-bridge circuitries has a first (TOP) and a second (BOT) power switch with each power switch being comprised of at least one power transistor and at least a corresponding power diode, a so-called recovery diode. The power semiconductor module furthermore has at least one positive polarity direct current lead and at least one negative polarity direct current lead. In accordance with the invention each half-bridge circuitry inside the power semiconductor module has at least two alternating current leads on the inside of the power semiconductor modules that are not directly electrically connected.

Another object of the present invention is to provide a circuitry system wherein low parasitic inductance is achieved by connecting per each half-bridge circuitry the at least one TOP transistor with the at least one power diode that corresponds to the BOT switch with the first alternating current lead that corresponds to this half-bridge circuitry. Also, per half-bridge circuitry of the at least one BOT transistor with the at least one power diode of the TOP switch, are connected to the second alternating current lead that corresponds to this half-bridge circuitry.

The present invention provides that one decisive criterion for low parasitic inductance is that during commutation, the areas surrounded by current are as small as possible. As will be discussed herein under, according to the state of the art the recovery diode that corresponds to the TOP transistor is arranged in close proximity. However, during commutation, for example when the TOP switch is turned off, the current flows through the TOP transistor and then through the recovery diode that corresponds to the BOT switch. The same of course applies to the recovery diode of the TOP switch when the BOT switch is turned off. According to the present invention, the detriments of the conventional arrangements are overcome by arranging the TOP transistor and the BOT recovery diode with regard to a first alternating current lead and by arranging the BOT transistor and the TOP recovery diode accordingly with regard to a second alternating current lead. Consequently, the area surrounded by current during commutation is smaller and is substantially reduced when compared to the conventional arrangements. Thus, as a consequence of the present invention, the parasitic inductance in the power semiconductor module is reduced.

Another object of the present invention is to provide a power semiconductor module wherein, the separation of the alternating current lead into a alternating current lead that corresponds to the TOP and one that corresponds to the BOT transistor furthermore provides for flexible outside wiring of the power semiconductor module. As a consequence one object of the present invention is that there can be different wiring schemes for the alternating current lead, depending on whether the current flows via the first (TOP) or the second (BOT) branch of the respective half-bridge circuit.

In another embodiment of the present invention, the housing 32 has a plurality of identical partial circuits of a half-bridge circuitry. Consequently, this inventive arrangement results in a complete half-bridge circuitry as described above comprising: a first (TOP) and a second (BOT) power switch. The power semiconductor modules have at least one positive polarity direct current lead and at least one negative polarity direct current lead.

According to another aspect of the present invention the transistors as discussed herein are IGBTs (insulated gate bipolar transistor).

Furthermore, each partial circuit within a first embodiment of this power semiconductor module has a least one TOP transistor, at least one power diode of the BOT switch and an alternate current lead with these components being connected like a circuit. Alternatively and adaptively, an alternative embodiment of this power semiconductor module has a least one BOT transistor, at least one power diode of the TOP switch and an alternating current lead with these components being connected like a circuit.

The present invention relates to a power semiconductor module with a housing and one or a plurality of half-bridge circuitries arranged therein. Each half-bridge circuitry has a first (TOP) and a second (BOT) power switch wherein each of these power switches is comprised of one power transistor and a corresponding power diode (recovery diode). The power semiconductor module furthermore has a positive polarity direct current lead and a negative polarity direct current lead. Per each half-bridge circuitry it furthermore has two alternate current leads that are not directly connected electrically. Each TOP transistor is connected to the power diode of the BOT switch and a first alternate current lead and each BOT transistor is connected to the power diode of the TOP switch and a second alternate current lead.

According to an embodiment of the present invention there is provided a power semiconductor module, comprising: a housing, at least one half-bridge circuit, each half-bridge circuit having a first (TOP) power switch and a second (BOT) power switch, each the power switch further comprising: at least one power transistor, at least one corresponding power diode, at least one positive polarity direct current lead, at least one negative polarity direct current lead, at least a first and a second alternate current lead per half-bridge circuit that are not in direct connection with respective the half-bridge circuit, and wherein in each the at least one half-bridge circuit, the at least one (TOP) transistor connects to the at least one power diode of the (BOT) power switch and the first alternate current lead and the at least one (BOT) transistor connects to the at least one power diode of the (TOP) power switch and the second alternate current lead, whereby the power semiconductor module has low parasitic inductance and enables reduced manufacturing effort.

According to another embodiment of the present invention there is provided a power semiconductor module, wherein: each the TOP power transistor being arranged proximate to each other and to the at least one power diode of the BOT power switch, and each the BOT power transistor being arranged proximate to each other and to the at least one power diode of the TOP switch.

According to another embodiment of the present invention there is provided a power semiconductor module, wherein: each the power transistor is an IGBT (insulated gate bipolar transistor).

According to another embodiment of the present invention there is provided a power semiconductor module, wherein: each the TOP power transistor being arranged proximate to each other and to the at least one power diode of the BOT switch, each the BOT power transistor being arranged proximate to each other and to the power diode of the TOP switch, and each the power transistor is an IGBT (insulated gate bipolar transistor).

According to another embodiment of the present invention there is provided a power semiconductor module, comprising: at least a first and a second housing, each the housing including a plurality of identical partial circuits of a half-bridge circuit design arranged in parallel therein wherein each respective half-bridge circuit design is further comprised of: a first (TOP) power switch and a second (BOT) power switch, each the power switch comprises: at least one power transistor, at least one corresponding power diode, at least one positive polarity direct current lead and at least one negative polarity direct current lead in each the housing of the power semiconductor module, wherein: each partial circuit of each the half-bridge circuit, comprising at least one of a first and second assembly, the first assembly including at least one of a TOP power transistor, at least one power diode of the BOT power switch, and a TOP alternate current lead, and the second assembly including at least one BOT power transistor, at least one power diode of the TOP power switch, and a BOT alternate current lead, whereby the power semiconductor module has low parasitic inductance and enables reduced manufacturing effort.

According to another embodiment of the present invention there is provided a power semiconductor module, comprising: at least a first housing and a second housing, the first housing including first partial circuits of a first three-phase bridge circuit, the first partial circuits of the first three-phase bridge circuit being a first parallel circuit arrangement of three respective TOP power switches and three respective power diodes of three respective BOT power switches, each the first partial circuit including an individual first alternate current lead, the second housing including second partial circuits of a second three-phase bridge circuit, the second partial circuits of the second three-phase bridge circuit being a second parallel circuit arrangement of the three respective BOT power switches and three respective power diodes of the TOP power switches, and each the second partial circuit including an individual second alternate current lead.

According to another embodiment of the present invention there is provided a power semiconductor module, further comprising: a reluctance motor having three motor windings, and respective ones of the three motor windings connecting to respective ones of the alternative current leads of the first partial circuit and respective ones of the alternative current leads of the second partial circuit, wherein the power semiconductor module with multiple housings enables a circuit with low parasitic inductance, easy manufacturing, and an easily adaptable wiring assembly.

The above, and other objects, features and advantages of the present invention will become apparent from the following description read in conduction with the accompanying drawings, in which like reference numerals designate the same elements.

DETAILED DESCRIPTION OF THE PREFERRED EMBODIMENTS

Figure 1A:
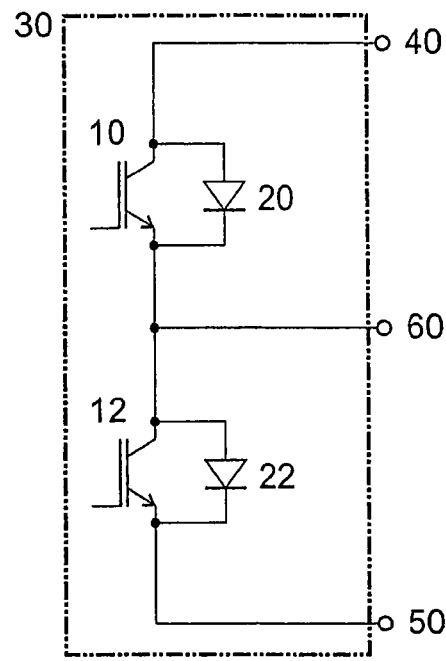
FIGS. 1A and 1B provide conventional power semiconductor modules with half or three-phase bridge circuitry respectively.
Figure 1B:
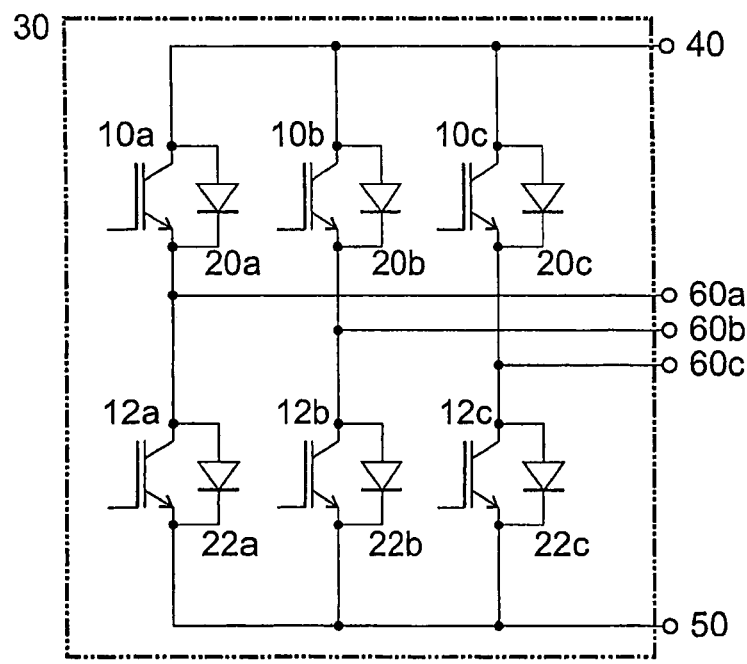

Reference will now be made in detail to several embodiments of the invention that are illustrated in the accompanying drawings. Wherever possible, same or similar reference numerals are used in the drawings and the description to refer to the same or like parts or steps. The drawings are in simplified form and are not to precise scale. For purposes of convenience and clarity only, directional terms, such as top, bottom, up, down, over, above, and below may be used with respect to the drawings. These and similar directional terms should not be construed to limit the scope of the invention in any manner. The words "connect," "couple," and similar terms with their inflectional morphemes do not necessarily denote direct and immediate connections, but also include connections through mediate elements or devices.

Figure 2A:
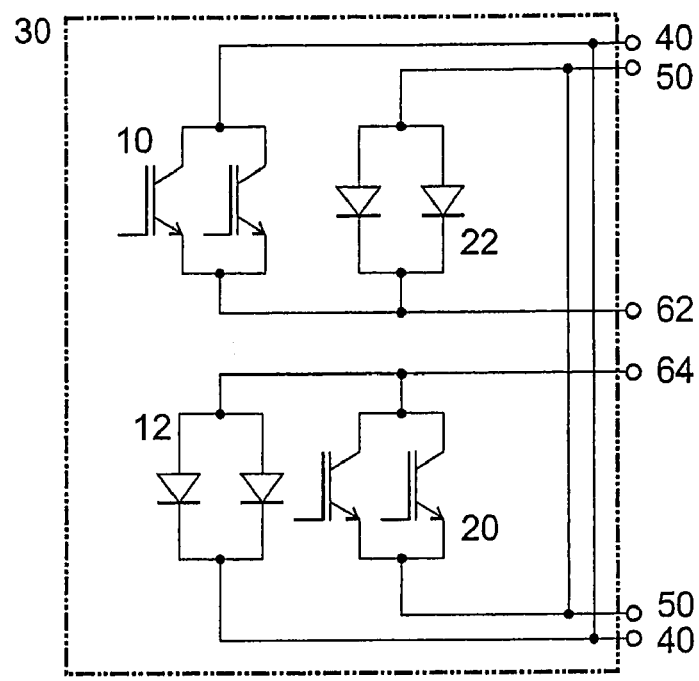
FIGS. 2A and 2B provide adaptive power semiconductor modules with half-bridge circuitry according to one embodiment of the present invention.

Referring now to FIG. 2A, a first embodiment of a power semiconductor module according to the present invention is proposed with half-bridge circuitry. For simplicity of conception, a power semiconductor module of the present invention includes housing 30 and half-bridge circuitry. However, unlike the conventional arts earlier discussed, the TOP switch is comprised of two TOP transistors 10 switched in parallel, preferably IGBTs, and two corresponding recovery diodes 20 that are also switched in parallel.

Analogously, the BOT switch includes two BOT transistors 12 that are switched in parallel and two corresponding recovery diodes 22 that are also similarly switched in parallel. The recovery diodes of each switch are physically arranged on the respective other switch.

It is especially preferred, although the arrangement of the components of the half-bridge circuitry already renders this obvious, to arrange the TOP transistors 10 and the recovery diodes 22 of the BOT switch just like the BOT transistors 12 and the recovery diodes 20 of the TOP switch in close proximity of each other. This further reduces the parasitic inductance of the power semiconductor module.

The inputs (collectors) of the TOP transistors 10 are connected to a first positive polarity direct current lead 40 of housing 30. The outputs (emitters) are connected to the first alternate current output 62 of the housing and to the cathodes of the recovery diode 22 of the BOT switch.

The anodes of recovery diodes 22 are connected to the first negative polarity direct current lead 50 of the housing 30. The arrangement of BOT transistors 12, recovery diodes 20 of the TOP switch and the second alternate current lead 64 of the housing 30 is analogous. The direct external connection of two alternate current leads 62, 64 results in an identical functionality (but not circuitry) of a power semiconductor module according to the state of the art shown in FIG. 1a.

Figure 2B:
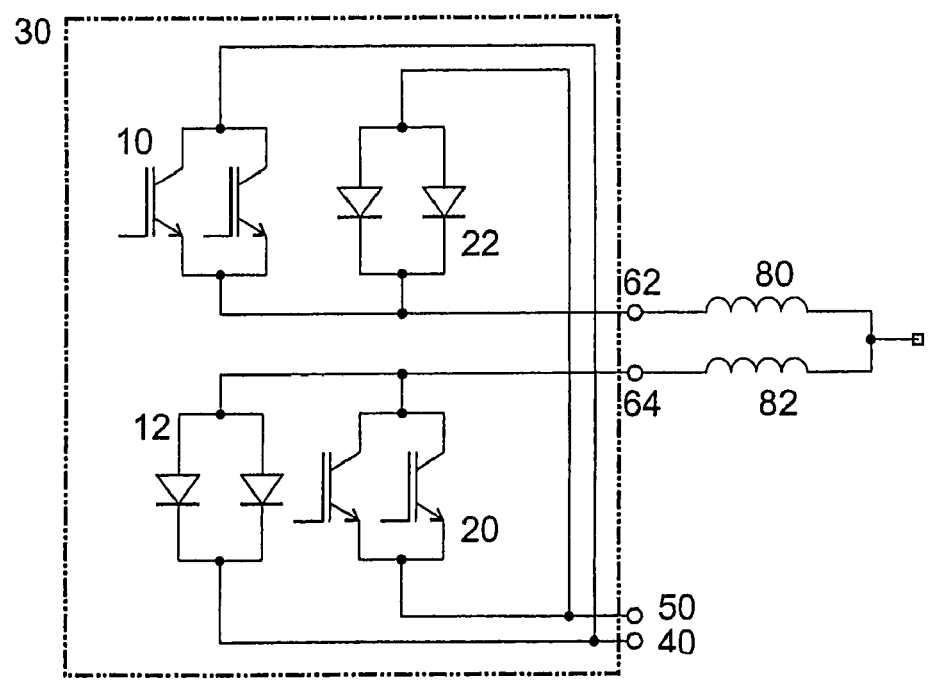

Regarding now to FIG. 2B, another embodiment of a power semiconductor module with half-bridge circuitry according to the invention. As shown, the arrangement of the components of the half-bridge circuit is identical to that described in FIG. 2A. However what is critical to understand is that the power semiconductor module only has one external positive 40 or negative 50 polarity direct current lead respectively. Furthermore, FIG. 2B shows that first 62 and second 64 alternate current outputs each have a coil 82, 84. Such wiring is shown as an example for preventing the switches from being destroyed in case of a bridge short-circuit since the short-circuit current, due to inductive law, increases slowly via the coils and thus a control circuit can shut off the respective circuit before it is destroyed.

Figure 3:
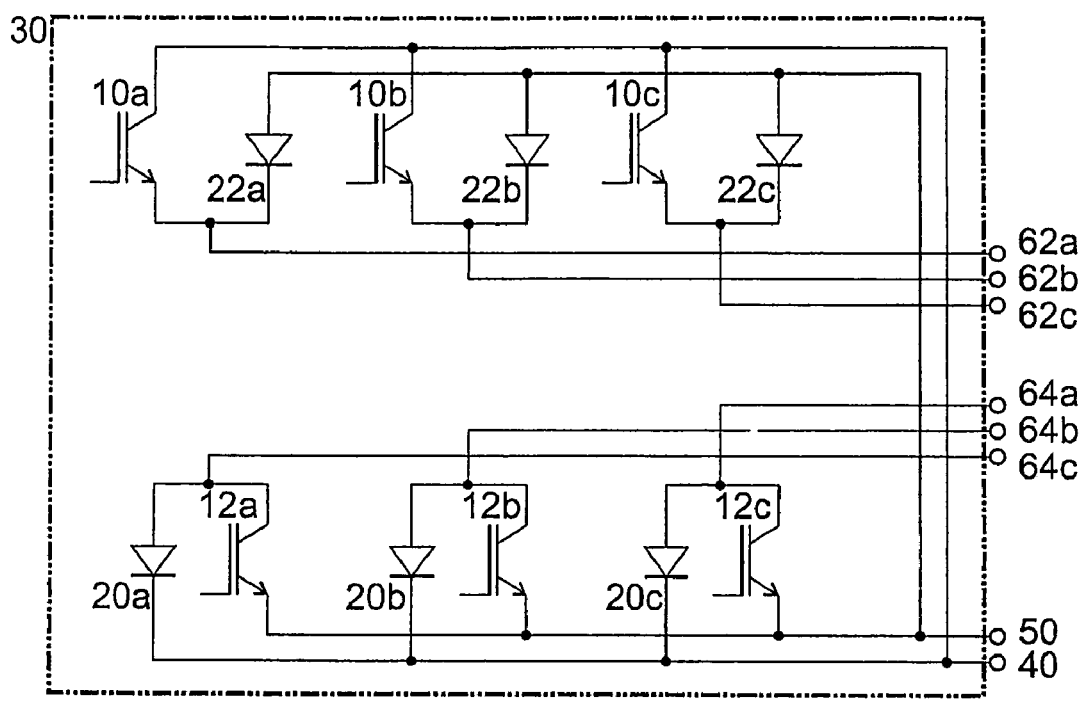
FIG. 3 shows a power semiconductor module with a three-phase bridge circuitry according to another aspect of the present invention.

Referring now to FIG. 3, an adaptive a power semiconductor module with a three-phase bridge circuitry is provided according to one aspect of the present invention. FIG. 3 shows a schematic view of a power semiconductor module with housing 30 (an adaptive housing and a three-phase bridge circuitry). Housing 30 in the present embodiment is comprised of a parallel arrangement of three half-bridge circuitries as described herein above FIG. 2. The inputs (collectors) of all TOP transistors 10a, 10b, 10c) of all three half-bridges are connected to the positive polarity direct current lead 40 of housing 30, as shown. The outputs (emitters) per each half-bridge are connected to a first alternate current output 62a, 62b, and 62c of the housing each and to the cathodes of recovery diodes 22a, 22b, 22c) of the BOT switches.

The anodes of recovery diodes 22a, 22b, and 22c are connected to the negative polarity direct current lead 50 of the housing. The arrangement comprised of BOT transistors 12a, 12b, 12c, recovery diodes 20a, 20b, 20c of the TOP switch and respective second alternate current lead 64a, 64b, 64c per half-bridge of housing 30 has an analogous arrangement.

Figure 4:
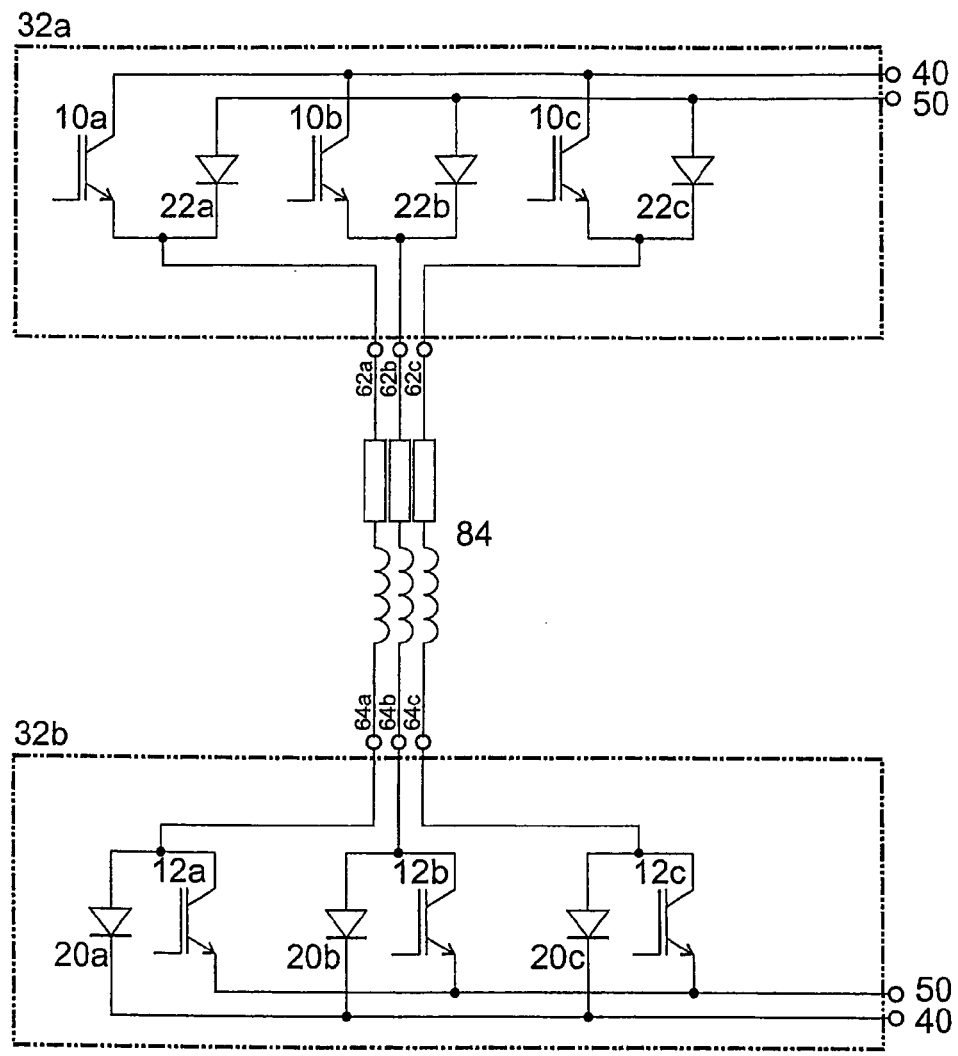
FIG. 4 shows another arrangement for a power semiconductor module with a partial circuit of a three-phase bridge circuitry.

Referring now to FIG. 4, another alternative embodiment of a power semiconductor module according to the present invention is provided.

As shown in FIG. 4, a first adaptive embodiment is shown in a first housing 32a and a second adaptive embodiment is shown in a second housing 32b. The first embodiment has housing 32a with first partial circuits of a three-phase bridge circuitry arranged in it and being comprised of a parallel arrangement of TOP transistor 10a, 10b, and 10c) with respective power diodes 22a, 22b, 22c) of the BOT switch and its own alternate current lead 62a, 62b, 62c). The second embodiment has second housing 32b with second partial circuits of a three-phase bridge circuitry arranged in it, with it being comprised of a parallel arrangement of BOT transistors 12a, 12b, 121c) with power diode 20a, 20b, and 20c) of the TOP switch and its own alternating current lead 64a, 64b, 64c). As discussed herein it is proposed that as used alternate current leads will be understood by those of skill in the art as being alternating current leads.

A reluctance motor 84, as shown has three rotor windings. The first lead of the first rotor winding is connected to alternate current output 62a of the first partial circuit of the first embodiment of the power semiconductor module according to the invention. The second lead of the first rotor winding is connected to the alternate current output 64a of the first partial circuit of the second embodiment of the power semiconductor module according to the invention. The other two rotor windings of reluctance motor 84 are analogously connected to the second and third partial circuits of the power semiconductor module.

As discussed herein, the present invention's embodiments of these two embodiments of the power semiconductor module makes it possible to arrange the components of a half-bridge lead that participate in a commutation process in close proximity to each other and to arrange them in a mutual housing 32a, 32b with low parasitic inductance and to furthermore provide a suitable connection to a motor, as used here a reluctance motor 84.

In the claims, means- or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

What is claimed is:

1. A power semiconductor module, comprising:
   a housing;
   at least one half-bridge circuit, each half-bridge circuit having a first TOP power switch and a second BOT power switch;
   each said power switch further comprising:
   at least one power transistor;
   at least one corresponding power diode;
   at least one positive polarity direct current lead,
   at least one negative polarity direct current lead;
   at least a first and a second alternate current lead per half-bridge circuit that are not in direct connection with respective said half-bridge circuit; and
   wherein in each said at least one half-bridge circuit, said at least one TOP transistor connects to said at least one power diode of said BOT power switch and said first alternate current lead and said at least one BOT transistor connects to said at least one power diode of said TOP power switch and said second alternate current lead, whereby said power semiconductor module has low parasitic inductance and enables reduced manufacturing effort.

2. A power semiconductor module, according to claim 1, wherein:
   each said TOP power transistor being arranged proximate to each other and to said at least one power diode of said BOT power switch; and
   each said BOT power transistor being arranged proximate to each other and to said at least one power diode of said TOP switch.

3. A power semiconductor module, according to claim 2, wherein:
   each said power transistor is an IGBT (insulated gate bipolar transistor).

4. A power semiconductor module according to claim 1, wherein:
   each said TOP power transistor being arranged proximate to each other and to said at least one power diode of said BOT switch;
   each said BOT power transistor being arranged proximate to each other and to said power diode of said TOP switch; and
   each said power transistor is an IGBT (insulated gate bipolar transistor).

5. A power semiconductor module, comprising:
   a housing;
   at least one half-bridge circuit, each half-bridge circuit having a first TOP power switch and a second BOT power switch;
   each said power switch further comprising:
   at least one power transistor;
   at least one corresponding power diode;
   at least one positive polarity direct current lead,
   at least one negative polarity direct current lead;
   at least a first and a second alternate current lead per half-bridge circuit that are not in direct connection with respective said half-bridge circuit; and
   (i) wherein in each said at least one half-bridge circuit, said at least one TOP transistor connects to said at least one power diode of said BOT power switch and said first alternate current lead and said at least one BOT transistor connects to said at least one power diode of said TOP power switch and said second alternate current lead, whereby said power semiconductor module has low parasitic inductance and enables reduced manufacturing effort;
   (ii) wherein said at least one positive polarity direct current lead and said at least one negative polarity direct current lead are arranged at a minimum distance, and allow for minimum parasitic inductance; and
   (iii) wherein said alternating current leads are not arranged with said direct current leads.

6. A power semiconductor module, according to claim 1, wherein:
   each said TOP power transistor being arranged proximate to each other and to said at least one power diode of said BOT power switch; and
   each said BOT power transistor being arranged proximate to each other and to said at least one power diode of said TOP switch.

7. A power semiconductor module, according to claim 2, wherein each said power transistor is an IGBT (insulated gate bipolar transistor).

8. A power semiconductor module according to claim 1, wherein:
   each said TOP power transistor being arranged proximate to each other and to said at least one power diode of said BOT switch;
   each said BOT power transistor being arranged proximate to each other and to said power diode of said TOP switch; and
   each said power transistor is an IGBT (insulated gate bipolar transistor).

* * * * *